United States Patent
Camacho et al.

(10) Patent No.: US 7,732,901 B2
(45) Date of Patent: *Jun. 8, 2010

(54) INTEGRATED CIRCUIT PACKAGE SYSTEM WITH ISLOATED LEADS

(75) Inventors: Zigmund Ramirez Camacho, Singapore (SG); Henry Descalzo Bathan, Singapore (SG); Abelardo Hadap Advincula, Jr., Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 105 days.

This patent is subject to a terminal disclaimer.

(21) Appl. No.: 12/050,428

(22) Filed: Mar. 18, 2008

(65) Prior Publication Data
US 2009/0236704 A1 Sep. 24, 2009

(51) Int. Cl.
H01L 23/495 (2006.01)
(52) U.S. Cl. ...................... 257/676; 438/123
(58) Field of Classification Search .............. 257/4,
257/72, 81, 91, 98–100, 144, 150–153, 175–179,
257/181, 182, 203, 207–211, 246–250, 276,
257/382–385, 401, 418, 433, 434, 448, 457,
257/459, 502, 503, 508, 522, 534, 554, 573,
257/576, 584, 587, 602, 282–284, 309, 317,
257/377, 676; 438/123
See application file for complete search history.

(56) References Cited

U.S. PATENT DOCUMENTS

| | | | |
|---|---|---|---|
| 5,340,771 A | 8/1994 | Rostoker | |
| 5,365,409 A | 11/1994 | Kwon et al. | |
| RE36,894 E | 10/2000 | Greenberg et al. | |
| 6,348,726 B1 * | 2/2002 | Bayan et al. | 257/666 |
| 6,498,392 B2 | 12/2002 | Azuma | |
| 6,689,640 B1 | 2/2004 | Mostafazadeh | |
| 6,818,973 B1 * | 11/2004 | Foster | 257/676 |
| 6,836,008 B2 | 12/2004 | Yu et al. | |
| 6,975,038 B1 | 12/2005 | Mostafazadeh | |
| 7,109,572 B2 | 9/2006 | Fee et al. | |
| 7,186,588 B1 | 3/2007 | Bayan et al. | |
| 2007/0093000 A1 | 4/2007 | Shim et al. | |
| 2009/0085177 A1 | 4/2009 | Pisigan et al. | |
| 2009/0115040 A1 | 5/2009 | Camacho et al. | |

* cited by examiner

*Primary Examiner*—Thien F Tran
(74) *Attorney, Agent, or Firm*—Mikio Ishimaru (57) ABSTRACT

An integrated circuit package system comprising: forming a finger; forming a die pad adjacent the finger; applying a fill material around the finger and the die pad; forming a cavity in the finger and fill material; and attaching an integrated circuit die over the die pad adjacent the finger with the fill material.

20 Claims, 7 Drawing Sheets

INTEGRATED CIRCUIT PACKAGE SYSTEM WITH ISLOATED LEADS

CROSS-REFERENCE TO RELATED APPLICATION(S)

The present application contains subject matter related to co-pending U.S. patent application Ser. No. 11/936,516 filed Nov. 7, 2007.

The present application also contains subject matter related to co-pending U.S. patent application Ser. No. 11/862,406 filed Sep. 27, 2007.

The related applications are assigned to STATS ChipPAC Ltd.

TECHNICAL FIELD

The present invention relates generally to integrated circuits and more particularly to a system for integrated circuit packages with leads.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes and other electronic devices must also become smaller and thinner with more functions and connections. In packaging components, the need for connecting leads largely influences package dimensions. Many attempts have been made to create a surface mount type of packaging for semiconductor devices having a lead-less structure in which connecting leads are not needed.

Area array packages such as a ball grid array (BGA) require more materials and processing than more established technologies such as lead frame technology. The BGA package requires a substrate with traces, vias, and solder balls typically preformed for a specific range of integrated circuit device dimensions, input/output (I/O) count, and I/O functions.

Typically, area array packages use a laminate substrate to achieve higher lead counts while lead frame packages use less expensive materials and simpler processes resulting in higher reliability. For example, laminate is not able to withstand pressure cooker tests (PCT) in the same way as lead frame packages. Corrosion tests such as PCT have been a limitation of laminate packages.

Lead frame packaging relies on spacing between connecting leads of a lead frame to be very small in order to connect a device having many signal pins. Width or thickness of each lead should also be reduced but leads bend easily causing unwanted open or short circuits. Unfortunately, package size is often relegated to relatively large dimensions and spacing.

Current high-count lead frame packages require a relatively high number of fabrication steps making fabrication process complicated thereby increasing manufacturing costs. Attempts to provide projected portions at the bottom of a package often require forming metal film on the surface of the projected portions are complicated and costly.

In other attempts, etching processes are required to pattern metal foil for the die pads and leads further complicating manufacturing processes. It is also necessary to use a base apparatus for supporting the metal foil when patterning. This base apparatus is unnecessary after manufacturing the semiconductor integrated circuit device but still increases costs and complexity.

If metal foil is patterned after packaging the semiconductor device, the base apparatus becomes unnecessary. However, since the etching process is typically performed by wet etching, it is necessary to provide water resistant protection for the package including the semiconductor device when the etching is performed. Therefore, these manufacturing processes are also complicated and increase costs.

Yet other attempts require a pattern layer between the frame-like structures and column-like structures. These additional components increase manufacturing complexity and costs. The, number of manufacturing processes steps alone can significantly increase manufacturing processing costs.

Current attempts have many issues often requiring additional components such as metal film, electrodes of metal foil, column-like structures, and pattern layers. These components are pre-designed and manufactured into specific patterns and sizes with additional design and fabrication for different applications. Inventory and manufacturing are complicated and costly.

Thus, a need still remains for improving numbers of leads, compatibility, flexibility, reliability, yield, and manufacturing throughput to control costs and improve performance in systems for integrated circuit packages with isolated leads.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides forming a finger; forming a die pad adjacent the finger; applying a fill material around the finger and the die pad; forming a cavity in the finger and fill material; and attaching an integrated circuit die over the die pad adjacent the finger with the fill material.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 1:
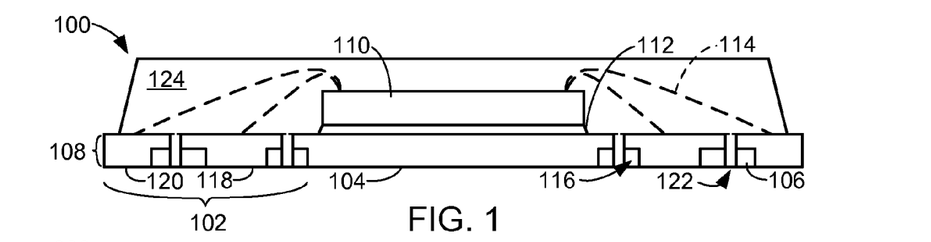
FIG. 1 is a cross-sectional view of an integrated circuit package system along lines 1-1 of FIG. 3 in a first embodiment of the present invention.
Figure 3:
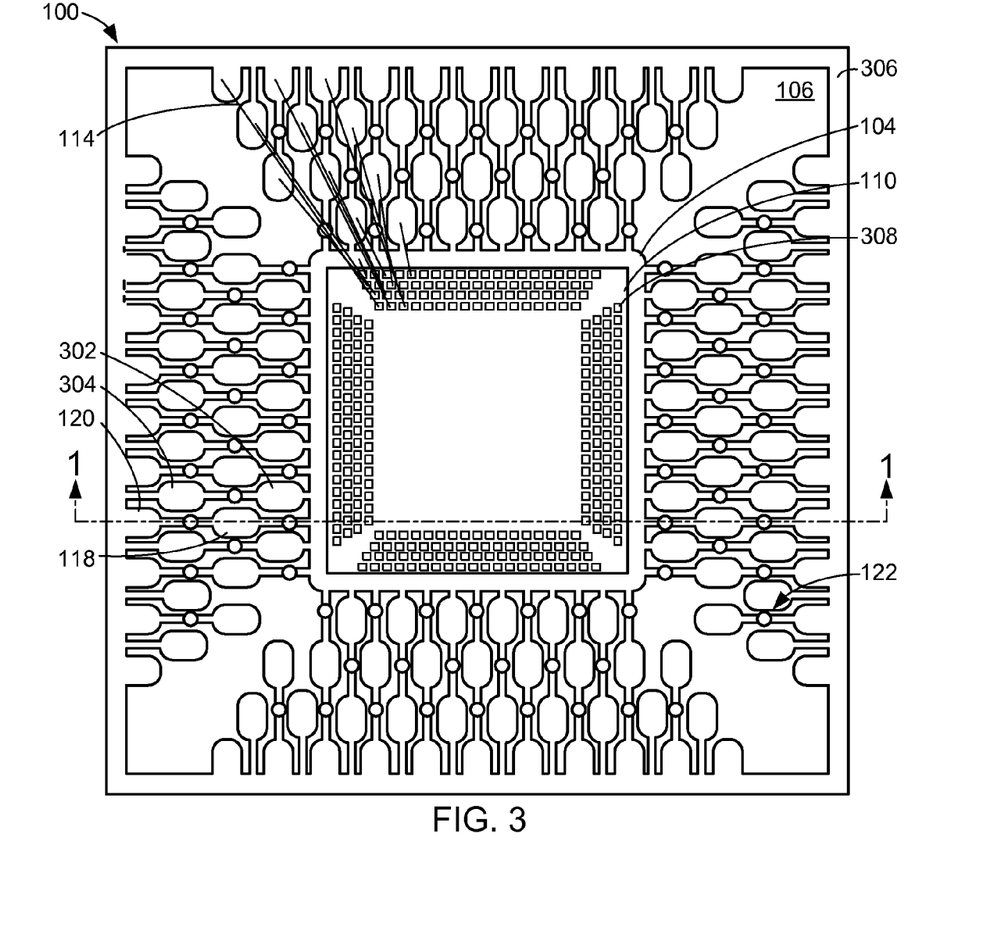
FIG. 3 is a top plan view of the structure of FIG. 1 in a connection phase.

Referring now to FIG. 1, therein is shown a cross-sectional view of an integrated circuit package system 100 along lines 1-1 of FIG. 3 in a first embodiment of the present invention. The integrated circuit package system 100 preferably includes fingers 102 adjacent a die pad 104. A fill material 106 such as a pre-mold material can be formed around the fingers 102 and the die pad 104 particularly on interior surfaces.

A leadframe subassembly 108 includes the fingers 102, the die pad 104, and the fill material 106. During processing, the leadframe subassembly 108 can include the fingers 102 and the die pad 104 as contiguous or connected elements as well as include other elements formed of the same or similar materials. The leadframe subassembly 108 can optionally be preformed or provided as a distinct structure.

An integrated circuit die 110 can be mounted over the die pad 104 with a mount material 112 such as a tape, paste, or liquid with adhesive properties. Die connectors 114 such as bond wires, planar interconnect, flip chip bumps can electrically connect the integrated circuit die 110 and the fingers 102. Optionally the die connectors 114 or the mount material 112 can electrically connect a backplane of the integrated circuit die 110 and the die pad 104.

The fingers 102 can preferably include a recess 116 providing structural definition to an inner lead 118, an outer lead 120, or the die pad 104. A cavity 122 can be formed near the recess 116 through the fill material 106 and the fingers 102 providing isolation of the inner lead 118, the outer lead 120, and the die pad 104.

An encapsulant 124 can be formed over the die connectors 114, the integrated circuit die 110, the fingers 102, the fill material 106, and the die pad 104 to provide structural integrity and protection. The encapsulant 124 such as a mold compound or epoxy material can include the same or different material as the fill material 106.

It has been discovered that the integrated circuit package system 100 having the fingers 102 having the inner lead 118 and the outer lead 120, the die pad 104, and the fill material 106, such as the leadframe subassembly 108, improves the input/output count, process flow, materials, and reliability resulting in significantly reduced costs.

Figure 2:
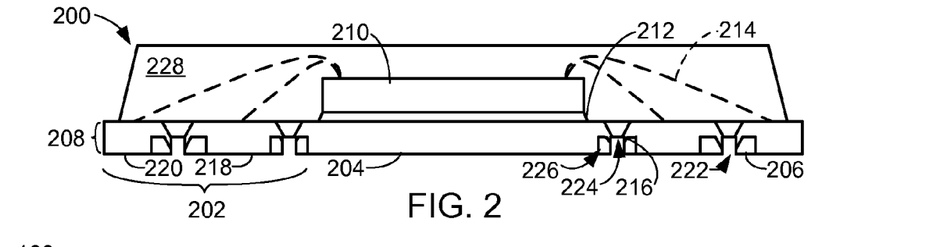
FIG. 2 is a cross-sectional view of an integrated circuit package system in a second embodiment of the present invention.

Referring now to FIG. 2 therein is shown a cross-sectional view of an integrated circuit package system 200 in a second embodiment of the present invention. The integrated circuit package system 200 preferably includes fingers 202 adjacent a die pad 204. A fill material 206 such as a pre-mold material can be formed around the fingers 202 and the die pad 204 particularly on interior surfaces.

A leadframe subassembly 208 includes the fingers 202, the die pad 204, and the fill material 206. During processing, the leadframe subassembly 208 can include the fingers 202 and the die pad 204 as contiguous or connected elements as well as include other elements formed of the same or similar materials. The leadframe subassembly 208 can optionally be preformed or provided as a distinct structure.

An integrated circuit die 210 can be mounted over the die pad 204 with a mount material 212 such as a tape, paste, or liquid with adhesive properties. Die connectors 214 such as bond wires, planar interconnect, flip chip bumps can electrically connect the integrated circuit die 210 and the fingers 202. Optionally the die connectors 214 or the mount material 212 can electrically connect a backplane of the integrated circuit die 210 and the die pad 204.

The fingers 202 can preferably include a lead connector 216 such as an etched portion of the fingers 202 providing temporary connectivity to an inner lead 218, an outer lead 220, or the die pad 204. A cavity 222 can be formed through the lead connector 216 and partially through the fill material 206 isolating the inner lead 218, the outer lead 220, and the die pad 204.

The lead connector 216 can be formed having a thinned region providing one or more of a finger top recess 224 and one or more of a finger bottom recess 226. The finger top recess 224 can provide separation for the inner lead 218, the outer lead 220, or the die pad 204. The finger bottom recess 226 can provide a significantly reduced region of the lead connector 216 resulting in easier isolation due in part to less material of the lead connector 216.

An encapsulant 228 can be formed over the die connectors 214, the integrated circuit die 210, the fingers 202, the fill material 206, and the die pad 204 to provide structural integrity and protection. The encapsulant 228 such as a mold compound or epoxy material can include the same or different material as the fill material 206.

Referring now to FIG. 3, therein is shown a top plan view of the structure of FIG. 1 in a connection phase. The integrated circuit package system 100 preferably includes a plurality of the outer lead 120, third row inner leads 302, a plurality of the inner lead 118 in a second row, and first row inner leads 304 adjacent the die pad 104.

The fill material 106 can be formed around the first row inner leads 304, the plurality of the inner lead 118 in a second row, the third row inner leads 302, the plurality of the outer lead 120, and the die pad 104. The fill material 106 provides structural integrity and substantially fixed positions for the first row inner leads 304, the inner lead 118, the third row inner leads 302, and the outer lead 120.

The cavity 122 provides isolation for each of the first row inner leads 304, the plurality of the inner lead 118 in a second row, the third row inner leads 302, the plurality of the outer lead 120, and the die pad 104. For illustrative purposes, the cavity 122 is shown in a shape of a circle although it is understood the cavity 122 may be of any shape provided by any removal process.

For illustrative purposes, a dam bar 306 is shown although it is understood that the dam bar 306 may be optional in the connection phase. The fill material 106 can be formed in an interior region of the dam bar 306 adjacent the first row inner leads 304, the inner lead 118, the third row inner leads 302, the outer lead 120, and the die pad 104 providing structural integrity for removal of the dam bar 306.

The die connectors 114 can electrically connect connection sites 308, such as bond pads or bump pads of the integrated circuit die 110, and the first row inner leads 304, the plurality of the inner lead 118, the third row inner leads 302, and the plurality of the outer lead 120 or optionally the die pad 104.

Figure 4:
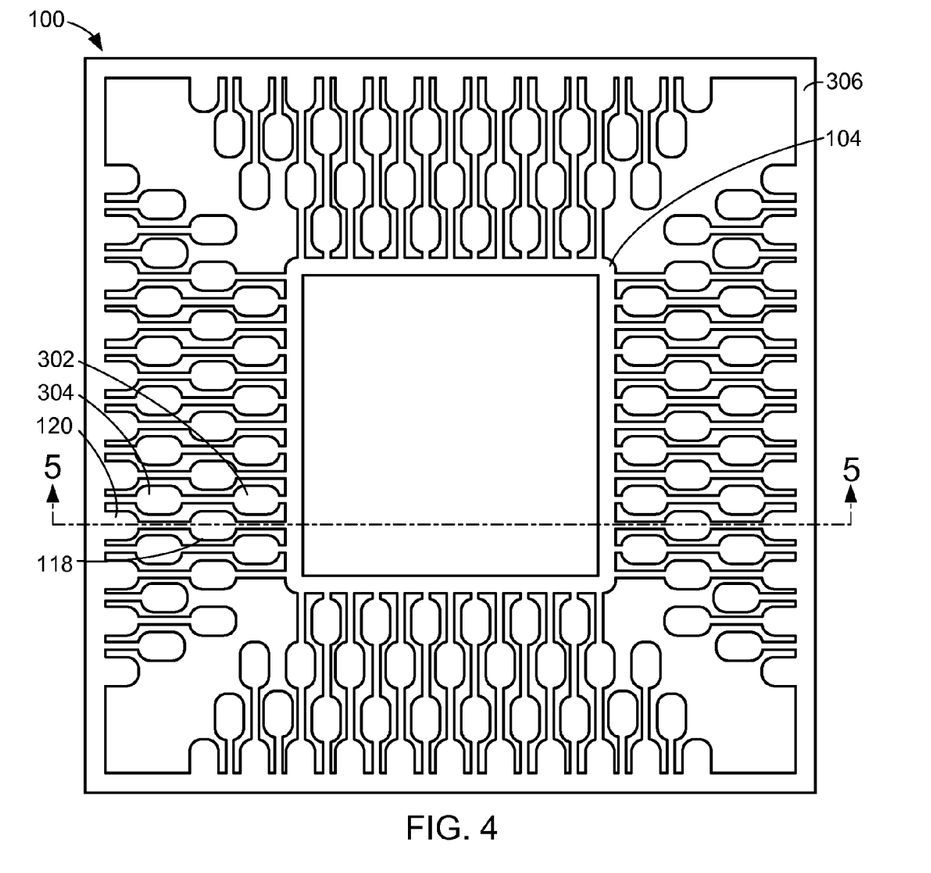
FIG. 4 is a top plan view of the integrated circuit package system in a formation phase.

Referring now to FIG. 4, therein is shown a top plan view of the integrated circuit package system 100 in a formation phase. The integrated circuit package system 100 preferably includes the fingers 102, the die pad 104, and the dam bar 306. The fingers 102 include the first row inner leads 304, the inner lead 118, the third row inner leads 302, and the outer lead 120.

The first row inner leads 304, the inner lead 118, the third row inner leads 302, the outer lead 120, and the die pad 104 can be contiguous or connected for structural integrity and substantially fixed positions during processing. The dam bar 306 typically can be partially removed or substantially removed during further processing.

Figure 5:
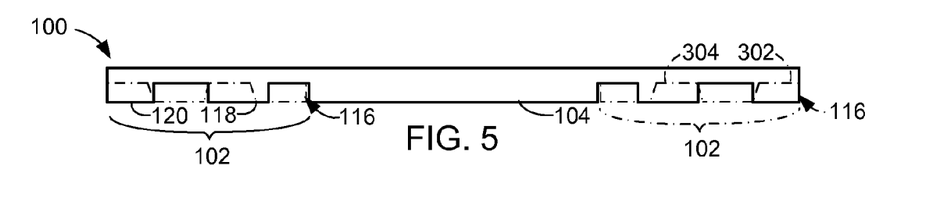
FIG. 5 is a cross-sectional view of the structure of FIG. 4 taken along line 5-5.

Referring now to FIG. 5, therein is shown a cross-sectional view of the structure of FIG. 4 taken along line 5-5. For clarity, the structure of FIG. 4 is shown without the dam bar 306 as shown in FIG. 4. The integrated circuit package system 100 preferably includes the fingers 102 and the die pad 104.

The fingers 102 can include the inner lead 118, the outer lead 120, and the recess 116. One or more of the recess 116 can be formed adjacent each of the inner lead 118, the outer lead 120, and the die pad 104.

Another of the fingers 102 can include the first row inner leads 304, and the third row inner leads 302 shown with phantom lines for clarity. One or more of the recess 116 can be formed adjacent each of the first row inner leads 304, the third row inner leads 302, and the die pad 104.

For illustrative purposes, the first row inner leads 304, the inner lead 118, the third row inner leads 302, and the outer lead 120 are shown although it is understood that any number or configuration of leads may be used.

Figure 6:
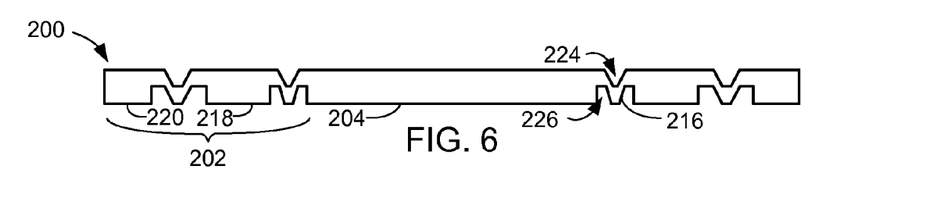
FIG. 6 is a cross-sectional view of the integrated circuit package system in a formation phase.

Referring now to FIG. 6, therein is shown a cross-sectional view of the integrated circuit package system 200 in a formation phase. The integrated circuit package system 200 preferably includes the fingers 202 and the die pad 204. The fingers 202 can include the inner lead 218, the outer lead 220, the finger top recess 224, or the finger bottom recess 226.

One or more of the finger top recess 224 can provide separation for the inner lead 218, the outer lead 220, or the die pad 204. One or more of the finger bottom recess 226 can provide a significantly reduced region of the lead connector 216 resulting in easier isolation due in part to the reduced quantity of material for the lead connector 216.

Figure 7:
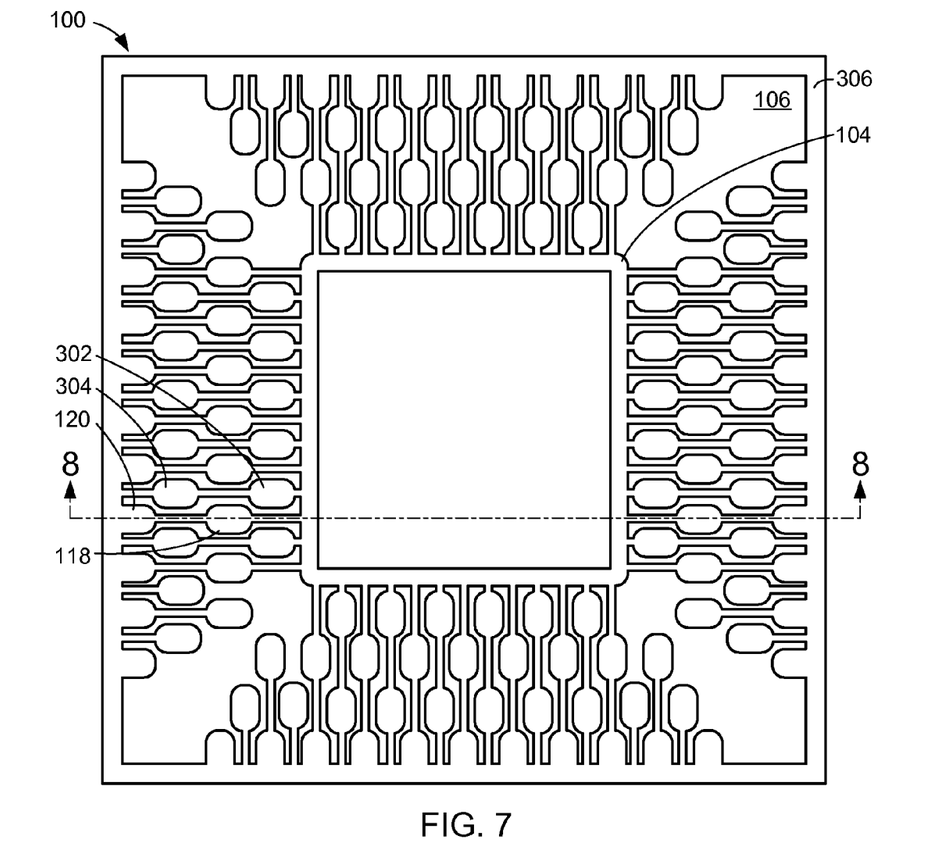
FIG. 7 is a top plan view of the structure of FIG. 4 in a fill phase.

Referring now to FIG. 7, therein is shown a top plan view of the structure of FIG. 4 in a fill phase. The integrated circuit package system 100 preferably includes the leadframe subassembly 108 having the fingers 102, the die pad 104, and the fill material 106. The fingers 102 can include the inner lead 118, the outer lead 120, and the recess 116. One or more of the recess 116 can be formed adjacent each of the inner lead 118, the outer lead 120, and the die pad 104.

The leadframe subassembly 108 can include the first row inner leads 304, the inner lead 118, the third row inner leads 302, the outer lead 120, and the die pad 104 as contiguous or connected for structural integrity and substantially fixed positions during processing. The leadframe subassembly 108 can optionally be preformed or provided as a distinct structure. The dam bar 306 typically can be partially removed or substantially removed during further processing.

Figure 8:
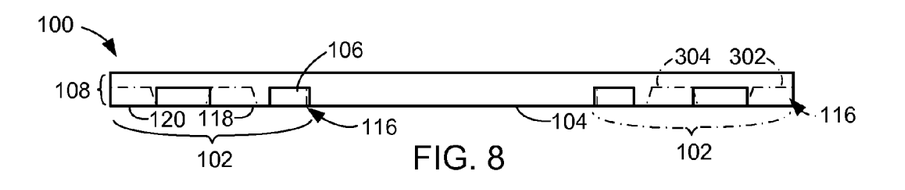
FIG. 8 is a cross-sectional view of the structure of FIG. 7 taken along line 8-8.

Referring now to FIG. 8, therein is shown a cross-sectional view of the structure of FIG. 7 taken along line 8-8. For clarity, the structure of FIG. 7 is shown without the dam bar 306 as shown in FIG. 7. The integrated circuit package system 100 preferably includes the leadframe subassembly 108 including the fill material 106 with one of the fingers 102 having the inner lead 118, the outer lead 120, the die pad 104, and one or more of the recess 116.

The leadframe subassembly 108 can also include another of the fingers 102 having the first row inner leads 304, and the third row inner leads 302 shown with phantom lines for clarity. One or more of the recess 116 with the fill material 106 can be formed adjacent each of the first row inner leads 304, the third row inner leads 302, and the die pad 104.

Figure 9:
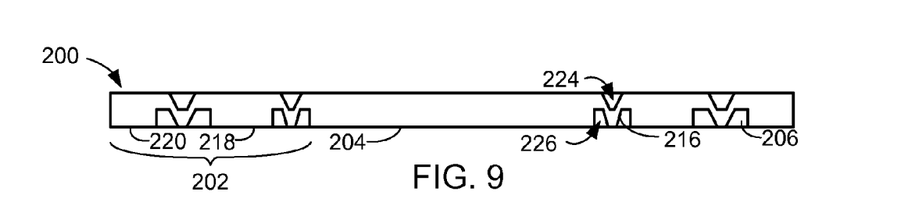
FIG. 9 is a cross-sectional view of the structure of FIG. 6 in a fill phase.

Referring now to FIG. 9, therein is shown a cross-sectional view of the structure of FIG. 6 in a fill phase. The integrated circuit package system 200 preferably includes the leadframe subassembly 208 including the fill material 206 with one of the fingers 202 having the inner lead 218, the outer lead 220, the die pad 204, the finger top recess 224, and the finger bottom recess 226.

The fill material 206 can be formed in one or more of the finger top recess 224 providing separation for the inner lead 218, the outer lead 220, or the die pad 204. The fill material 206 can also be formed in one or more of the finger bottom recess 226 with a significantly reduced region of the lead connector 216 also providing separation for the inner lead 218, the outer lead 220, or the die pad 204.

Figure 10:
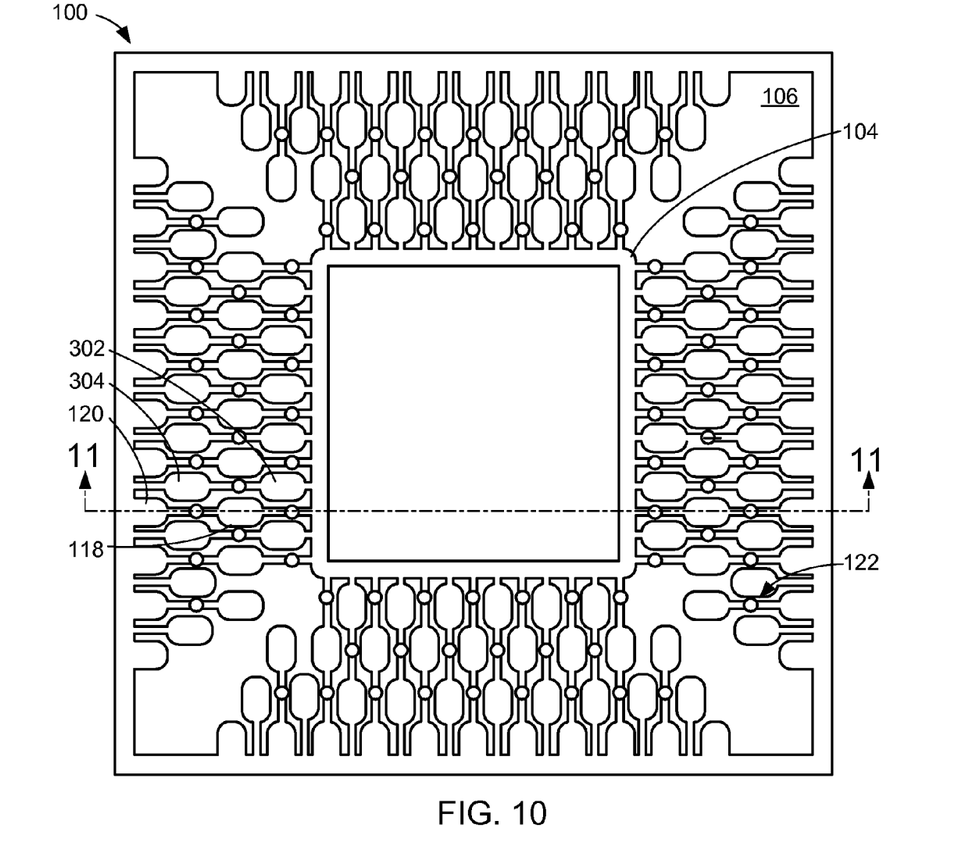
FIG. 10 is a top plan view of the structure of FIG. 7 in an isolation phase.

Referring now to FIG. 10, therein is shown a top plan view of the structure of FIG. 7 in an isolation phase. The integrated circuit package system 100 preferably includes the leadframe subassembly 108 including the cavity 122. The cavity 122 can be formed through the fingers 102 near the recess 116.

The leadframe subassembly 108 including the cavity 122 isolating the first row inner leads 304, the inner lead 118, the third row inner leads 302, the outer lead 120, and the die pad 104, can optionally be preformed or provided as a distinct structure. The dam bar 306 typically can be partially removed or substantially removed during further processing.

Figure 11:
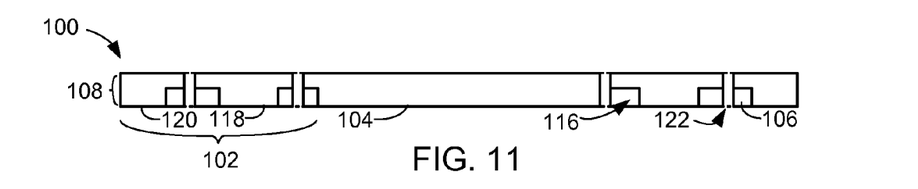
FIG. 11 is a cross-sectional view of the structure of FIG. 10 taken along line 11-11.

Referring now to FIG. 11, therein is shown a cross-sectional view of the structure of FIG. 10 taken along line 11-11. For clarity, the structure of FIG. 10 is shown without the dam bar 306 as shown in FIG. 10. The integrated circuit package system 100 preferably includes the leadframe subassembly 108 including the cavity 122. The cavity 122 can be formed through the fill material 106 and the fingers 102 near the recess 116.

The leadframe subassembly 108 includes the cavity 122 isolating the inner lead 118, the outer lead 120, and the die pad 104. The leadframe subassembly 108 can optionally be preformed or provided as a distinct structure. For illustrative purposes, the dam bar 306 has been substantially removed although it is understood that the dam bar 306 can be removed during further processing.

Figure 12:
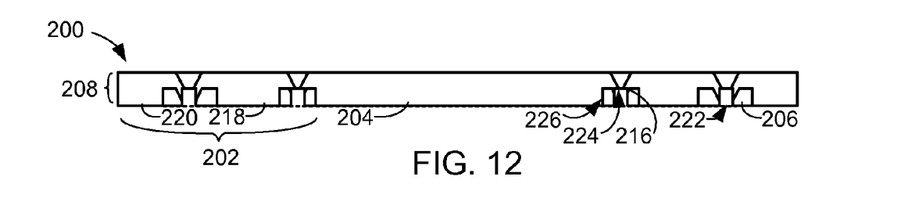
FIG. 12 is a cross-sectional view of the structure of FIG. 9 in an isolation phase.

Referring now to FIG. 12, therein is shown a cross-sectional view of the structure of FIG. 9 in an isolation phase. The integrated circuit package system 200 preferably includes the leadframe subassembly 208 including the cavity 222. The cavity 222 can be formed through the fill material 206 and the fingers 202 near the finger top recess 224 and the finger bottom recess 226.

The leadframe subassembly 208 includes the cavity 222 formed in one or more of the finger bottom recess 226 and through the significantly reduced region of the lead connector 216. The cavity 222 and the finger top recess 224 isolate the inner lead 118, the outer lead 220, and the die pad 204. The leadframe subassembly 208 can optionally be preformed or provided as a distinct structure.

Figure 13:
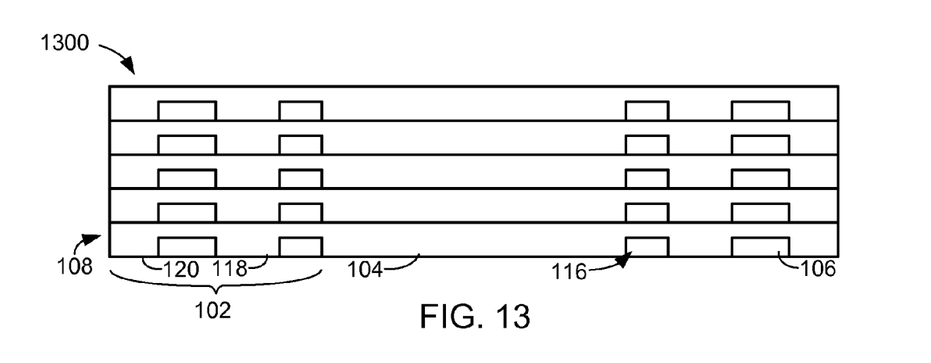
FIG. 13 is a cross-sectional view of an integrated circuit package system in a stack phase of a third embodiment of the present invention.

Referring now to FIG. 13, therein is shown a cross-sectional view of an integrated circuit package system 1300 in a stack phase of a third embodiment of the present invention. The integrated circuit package system 1300 can optionally includes stacking two or more of the leadframe subassembly 108 during processing.

The leadframe subassembly 108 can include the die pad 104 and the fingers 102 having the inner lead 118, the outer lead 120, and the recess 116 with the fill material 106. For illustrative purposes, each the leadframe subassembly 108 are shown having the recess 116 facing downward although it is understood that the leadframe subassembly 108 may be in any orientation.

Figure 14:
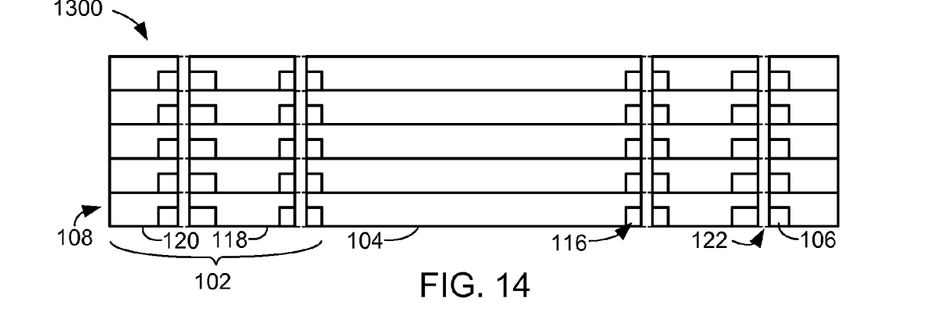
FIG. 14 is a cross-sectional view of the structure of FIG. 13 in an isolation phase.

Referring now to FIG. 14, therein is shown a cross-sectional view of the structure of FIG. 13 in an isolation phase. The integrated circuit package system 1300 can optionally include an isolation process such as mechanical drilling or laser drilling applied to two or more of the leadframe subassembly 108 in a stacked configuration.

The isolation process can provide each of the leadframe subassembly 108 with one or more of the cavity 122 in each of the fingers 102 thereby isolating the inner lead 118, the outer lead 120, and the die pad 104. Each of the leadframe subassembly 108 in the stacking configuration can optionally be preformed and provided as distinct structures.

Figure 15:
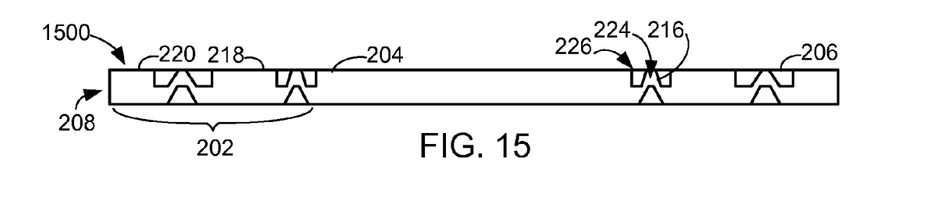
FIG. 15 is a cross-sectional view of an integrated circuit package system in a fill phase of a fourth embodiment of the present invention.

Referring now to FIG. 15, therein is shown a cross-sectional view of an integrated circuit package system 1500 in a fill phase of a fourth embodiment of the present invention. The integrated circuit package system 1500 preferably includes the structure of FIG. 9 in an inverted configuration for further processing.

The leadframe subassembly 208 includes the fill material 206 with one of the fingers 202 having the inner lead 218, the outer lead 220, the die pad 204, the finger top recess 224, and the finger bottom recess 226. The leadframe subassembly 208 can be oriented having the finger bottom recess 226 in an upward position for further processing.

Figure 16:
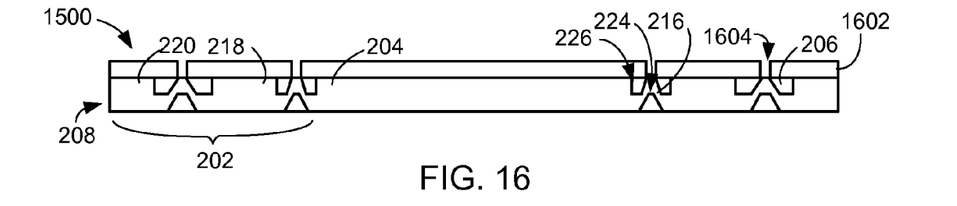
FIG. 16 is a cross-sectional view of the structure of FIG. 15 in an optional mask phase.

Referring now to FIG. 16, therein is shown a cross-sectional view of the structure of FIG. 15 in an optional mask phase. The integrated circuit package system 1500 can optionally include a mask layer 1602 over the finger bottom recess 226, the inner lead 218, the outer lead 220, and the die pad 204 of the leadframe subassembly 208.

A mask opening 1604 of the mask layer 1602 can be formed over the significantly reduced region of the lead connector 216 and the finger top recess 224 with the fill material 206 for further processing. An isolation process such as etching, mechanical drilling, or laser drilling can be applied through the mask opening 1604.

The mask opening 1604 can provide a region of the leadframe subassembly 208 predetermined by the isolation process to isolating the inner lead 218, the outer lead 220, and the die pad 204 as well as maintaining structural integrity of the leadframe subassembly.

Figure 17:
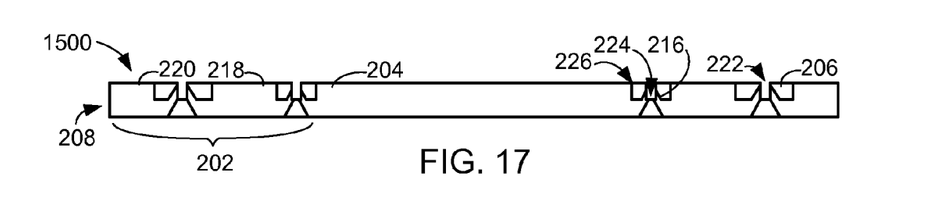
FIG. 17 is a cross-sectional view of the structure of FIG. 16 in an etch phase.

Referring now to FIG. 17, therein is shown a cross-sectional view of the structure of FIG. 16 in an etch phase. The integrated circuit package system 1500 preferably includes the leadframe subassembly 208 including the cavity 222. The cavity 222 can be formed through the fill material 206 and the fingers 202 over the finger top recess 224 and adjacent the finger bottom recess 226.

The leadframe subassembly 208 includes the cavity 222 formed in one or more of the finger bottom recess 226 and through the significantly reduced region of the lead connector 216. The cavity 222 and the finger top recess 224 isolate the inner lead 118, the outer lead 220, and the die pad 204. The mask layer 1602 of FIG. 16 can be removed for further processing of the leadframe subassembly 208.

Figure 18:
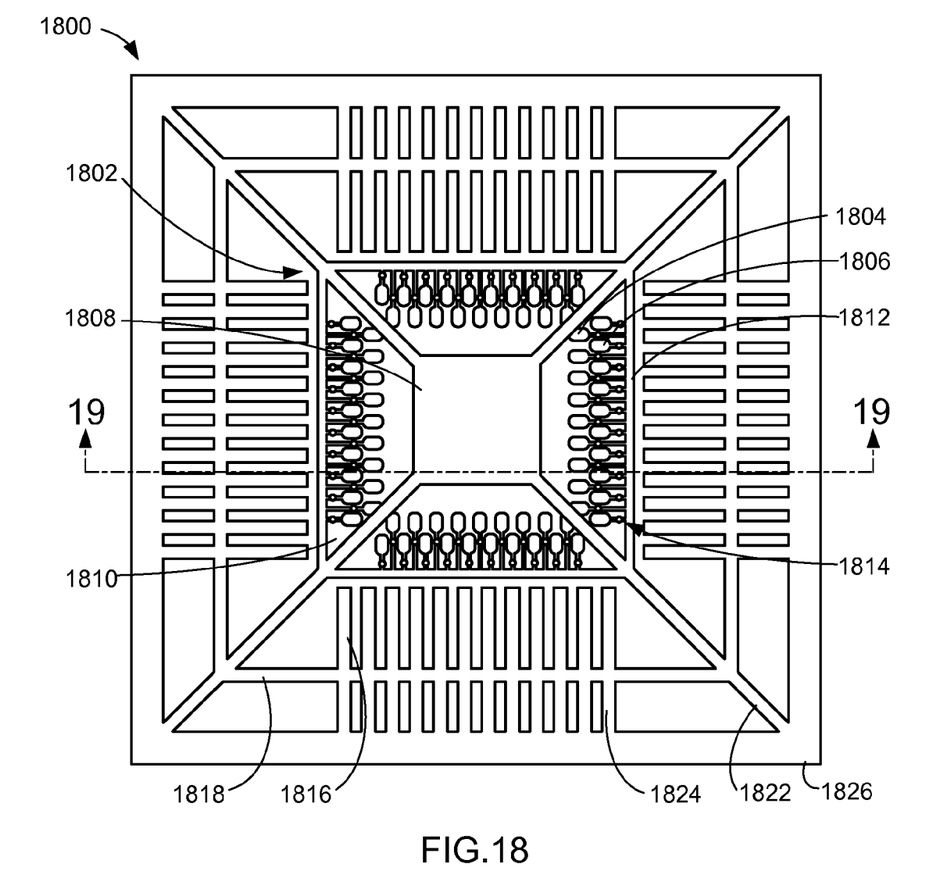
FIG. 18 is a top plan view of an integrated circuit package system in a fill phase of a fifth embodiment of the present invention.

Referring now to FIG. 18, therein is shown a top plan view of an integrated circuit package system 1800 in a fill phase of a fifth embodiment of the present invention. The integrated circuit package system 1800 preferably includes a leadframe subassembly 1802 including inner leads 1804, outer leads 1806, a die pad 1808, and a fill material 1810 such as a pre-mold material. The fill material 1810 can be formed around the inner leads 1804, the outer leads 1806, and the die pad 1808.

The fill material 1810 can also be formed within an interior of a subassembly connection bar 1812. The subassembly connection bar 1812 can be formed around the inner leads 1804 and the outer leads 1806 for structural integrity and substantially fixed locations during processing. The leadframe subassembly 1802 preferably includes cavities 1814 through the inner leads 1804 and the outer leads 1806 providing electrical isolation from the subassembly connection bar 1812.

Bond fingers 1816 can be formed around a perimeter of and substantially perpendicular to the subassembly connection bar 1812. A dam bar 1818 can be formed substantially parallel to the subassembly connection bar 1812 for structural integrity and substantially fixed locations of the bond fingers 1816. Tie bars 1822 can connect the dam bar 1818 to the leadframe subassembly 1802.

Terminal leads 1824 can be connected to an external perimeter of the dam bar 1818. For illustrative purposes, the terminal leads 1824 are shown substantially in line with the bond fingers 1816 although it is understood that the terminal leads 1824 and the bond fingers 1816 may be formed in any configuration or number.

A lead connection bar 1826 can be formed around a perimeter of and substantially parallel to the dam bar 1818 for structural integrity and substantially fixed locations of the terminal leads 1824, the bond fingers 1816, and the dam bar 1818 during processing. The tie bars 1822 can extend to the lead connection bar 1826.

For illustrative purposes, the tie bars 1822 are shown in a contiguous diagonal configuration connecting the subassembly connection bar 1812, the dam bar 1818, and the lead connection bar 1826 although it is understood that the tie bars 1822 may be configured or connected differently.

Figure 19:
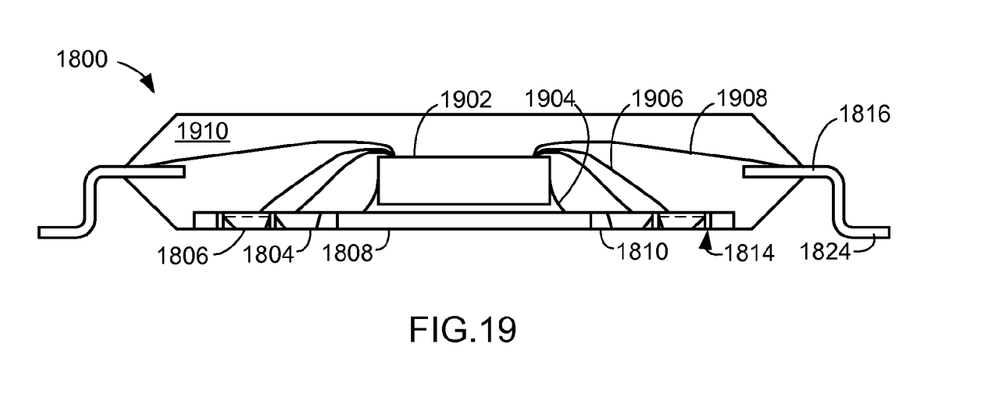
FIG. 19 is a cross-sectional view of the structure of FIG. 18 along line 19-19 in a singulation phase.

Referring now to FIG. 19, therein is shown a cross-sectional view of the structure of FIG. 18 along line 19-19 in a singulation phase. The integrated circuit package system 1800 preferably includes the leadframe subassembly 1802 with an integrated circuit die 1902 and an attachment layer 1904 thereover.

First connectors 1906 can electrically connect the integrated circuit die 1902 and the inner leads 1804 or the outer leads 1806. Second electrical connectors 1908 can electrically connect the integrated circuit die 1902 and the bond fingers 1816 thereby provide connectivity to the terminal leads 1824. The terminal leads 1824 can provide connectivity to a next level system such as another package or a next level system.

An encapsulant 1910 can be applied over the integrated circuit die 1902, the inner leads 1804, and the outer leads 1806 for protection and structural integrity. The encapsulant 1910 can also be applied over a portion of the bond fingers 1816 and the leadframe subassembly 1802 providing the terminal leads 1824 as well as a portion of the inner leads 1804 and the outer leads 1806 substantially exposed.

The lead connection bar 1826 of FIG. 18 can be substantially removed to provide singulation of the terminal leads 1824. A singulation process such as etching or cutting can be applied to the lead connection bar 1826 to separate, isolate, or singulate each of the terminal leads 1824 one from another.

Figure 20:
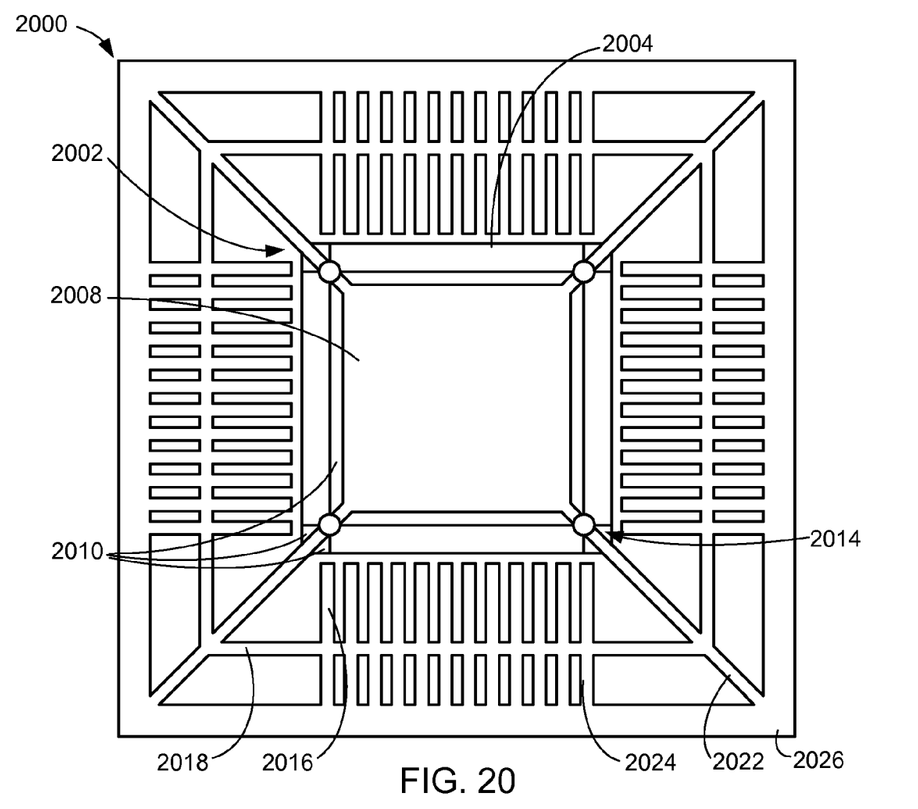
FIG. 20 is a top plan view of an integrated circuit package system in a fill phase of a sixth embodiment of the present invention.

Referring now to FIG. 20, therein is shown a top plan view of an integrated circuit package system 2000 in a fill phase of a sixth embodiment of the present invention. The integrated circuit package system 2000 preferably includes a leadframe subassembly 2002 including outer pads 2004, a die pad 2008 such as a ground pad, and a fill material 2010 such as a pre-mold material.

The fill material 2010 can be formed around the outer pads 2004 and the die pad 2008. The leadframe subassembly 2002 preferably includes cavities 2014 through the outer pads 2004 providing electrical isolation. The fill material 2010 can provide structural integrity and substantially fixed locations for the outer pads 2004 and the die pad 2008 particularly after formation of the cavities 2014.

Bond fingers 2016 can be formed around a perimeter of and substantially perpendicular to the outer pads 2004. A dam bar 2018 can be formed substantially parallel to the outer pads 2004 for structural integrity and substantially fixed locations of the bond fingers 2016. Tie bars 2022 can connect the dam bar 2018 to the leadframe subassembly 2002.

Terminal leads 2024 can be connected to an external perimeter of the dam bar 2018. For illustrative purposes, the terminal leads 2024 are shown substantially in line with the bond fingers 2016 although it is understood that the terminal leads 2024 and the bond fingers 2016 may be formed in any configuration or number.

A lead connection bar 2026 can be formed around a perimeter of and substantially parallel to the dam bar 2018 for structural integrity and substantially fixed locations of the terminal leads 2024, the bond fingers 2016, and the dam bar 2018 during processing. The terminal leads 2024 can be singulated by cavities similar to the cavities 2014 or the lead connection bar 2026 can be removed through a singulation process such as etching.

The tie bars 2022 can extend to the lead connection bar 2026. For illustrative purposes, the tie bars 2022 are shown in a contiguous diagonal configuration connecting the leadframe subassembly 2002, the dam bar 2018, and the lead connection bar 2026 although it is understood that the tie bars 2022 may be configured differently.

Figure 21:
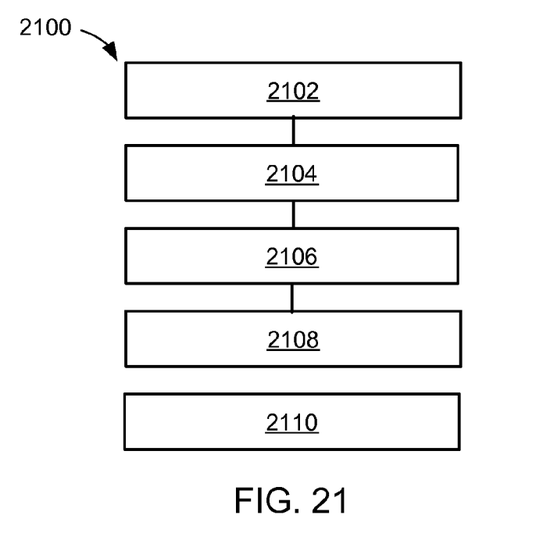
FIG. 21 is a flow chart of an integrated circuit package system for manufacturing the integrated circuit package system in an embodiment of the present invention.

Referring now to FIG. 21, therein is shown a flow chart of an integrated circuit package system 2100 for manufacturing the integrated circuit package system 100 in an embodiment of the present invention. The system 2100 includes forming a finger in a block 2102; forming a die pad adjacent the finger in a block 2104; applying a fill material around the finger and the die pad in a block 2106; forming a cavity in the finger and fill material in a block 2108; and attaching an integrated circuit die over the die pad adjacent the finger with the fill material in a block 2110.

In greater detail, a system to provide the method and apparatus of the integrated circuit package system 100, in an embodiment of the present invention, is performed as follows:

1. Forming a finger having an inner lead.
2. Forming a die pad adjacent the inner lead.
3. Applying a fill material around the inner lead and the die pad.
4. Forming a cavity in the finger and fill material adjacent the inner lead and the die pad.
5. Mounting an integrated circuit die over the die pad adjacent the inner lead with the fill material.
6. Attaching a connector to the integrated circuit die and the inner lead.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   a finger;
   a die pad adjacent the finger;
   a fill material around the finger and the die pad;
   a cavity in the finger and fill material; and
   an integrated circuit die over the die pad adjacent the finger with the fill material.

2. The system as claimed in claim 1 wherein the finger, the fill material around the finger, and the die pad is a leadframe subassembly.

3. The system as claimed in claim 1 wherein the finger includes a recess for isolation.

4. The system as claimed in claim 1 wherein the cavity includes the cavity through a lead connector and partially through the fill material.

5. The system as claimed in claim 1 further comprising a terminal lead adjacent a perimeter of a leadframe subassembly.

6. The system as claimed in claim 1 further comprising a die connector connected to the integrated circuit die and the finger.

7. The system as claimed in claim 6 wherein the cavity is through more than one of a leadframe subassembly.

8. The system as claimed in claim 6 wherein the cavity includes characteristics of formation with a mask layer.

9. The system as claimed in claim 6 further comprising a tie bar attached to the die pad.

10. The system as claimed in claim 6 wherein the finger is an outer pad adjacent a perimeter of the die pad.

11. A method of manufacture of an integrated circuit package system comprising:
    forming a finger;
    forming a die pad adjacent the finger;
    applying a fill material around the finger and the die pad;
    forming a cavity in the finger and fill material; and
    attaching an integrated circuit die over the die pad adjacent the finger with the fill material.

12. The method as claimed in claim 11 wherein applying the fill material around the finger and the die pad includes forming a leadframe subassembly.

13. The method as claimed in claim 11 wherein forming the finger includes forming a recess for isolation.

14. The method as claimed in claim 11 wherein forming the cavity includes forming the cavity through a lead connector and partially through the fill material.

15. The method as claimed in claim 11 further comprising forming a terminal lead adjacent a perimeter of a leadframe subassembly.

16. A method of manufacture of an integrated circuit package system comprising:
    forming a finger;
    forming a die pad adjacent the finger;
    applying a fill material around the finger and the die pad;
    forming a cavity in the finger and fill material;
    attaching an integrated circuit die over the die pad adjacent the finger with the fill material; and
    attaching a die connector to the integrated circuit die and the finger.

17. The method as claimed in claim 16 wherein forming the cavity includes forming the cavity through more than one of a leadframe subassembly.

18. The method as claimed in claim 16 wherein forming the cavity includes forming the cavity with a mask layer.

19. The method as claimed in claim 16 wherein forming the die pad includes attaching a tie bar to the die pad.

20. The method as claimed in claim 16 wherein forming the finger includes forming an outer pad adjacent a perimeter of the die pad.

* * * * *

UNITED STATES PATENT AND TRADEMARK OFFICE
CERTIFICATE OF CORRECTION

| | | |
|---|---|---|
| PATENT NO. | : 7,732,901 B2 | Page 1 of 1 |
| APPLICATION NO. | : 12/050428 | |
| DATED | : June 8, 2010 | |
| INVENTOR(S) | : Camacho et al. | |

It is certified that error appears in the above-identified patent and that said Letters Patent is hereby corrected as shown below:

Title page, Item (54), Title: delete "ISLOATED" and insert therefor --ISOLATED--

In column 1, line 2, delete "ISLOATED" and insert therefor --ISOLATED--

Signed and Sealed this

Twenty-fourth Day of August, 2010

David J. Kappos
*Director of the United States Patent and Trademark Office*